United States Patent
Lee et al.

(10) Patent No.: US 6,665,229 B2
(45) Date of Patent: Dec. 16, 2003

(54) SEMICONDUCTOR MEMORY DEVICE ROW DECODER STRUCTURES HAVING REDUCED LAYOUT AREA, AND METHODS OF OPERATING THE SAME

(75) Inventors: Byeong-Hoon Lee, Seoul (KR); Seung-Keun Lee, Kyonggi-do (KR)

(73) Assignee: SamSung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/122,131

(22) Filed: Apr. 11, 2002

(65) Prior Publication Data

US 2002/0176312 A1 Nov. 28, 2002

(30) Foreign Application Priority Data

May 23, 2001 (KR) .................................. 10-2001-28258

(51) Int. Cl.[7] ................................................. G11C 8/00
(52) U.S. Cl. ........................... 365/230.06; 365/230.03; 365/189.11; 365/189.09
(58) Field of Search ................... 365/230.06, 230.03, 365/189.11, 189.09, 185.13, 185.11, 185.17, 185.18

(56) References Cited

U.S. PATENT DOCUMENTS 6,459,645 B2 * 10/2002 Guliani et al. ......... 365/230.03

* cited by examiner

Primary Examiner—David Lam
(74) Attorney, Agent, or Firm—Marger Johnson & McCollom, P.C.

(57) ABSTRACT

Semiconductor memory device row decoder structures have reduced layout area. A structure for erasing memory cells coupled to a single bitline includes a single bias driver for these cells, and a plurality of local voltage level converters coupled to the bias driver. At least one word line driver is coupled to each local level converter, to erase at least one of the memory cells. A global word line is also coupled to the word line driver. A method for erasing these memory cells includes biasing the local level converter, for powering in turn a component of the word line driver. In addition, an existing global word line driver powers another component of the word line driver, thus resulting in reduced design requirements for the local level converter.

11 Claims, 12 Drawing Sheets

| OPERATION MODE | W/L | B/L | S/L | BULK |
|---|---|---|---|---|
| PROGRAM | +10V | +5V | 0V | 0V |
| ERASE | -10V | FLOATING | FLOATING | +10V |
| READ | +5V | +1V | 0V | 0V |

|  | READ | | PROGRAM | | ERASE | |
| --- | --- | --- | --- | --- | --- | --- |
|  | SELECTED | NON-SELECTED | SELECTED | NON-SELECTED | SELECTED | NON-SELECTED |
| PWL | 5V | 0V | 10V | 0V | 0V | 0V |
| Vpx | 5V | 5V | 10V | 5V | 0V | 0V |
| Vex | 0V | 0V | 0V | 0V | -10V | 0V |
| Vpbias | 0V | 0V | 9V | 9V | -10V | -10V |
| GWL | Vcc | 0V | Vcc | 0V | -10V | -10V |
| SS | Vcc | 0V | Vcc | 0V | 0V | 0V |

FIG. 11

1110 BIAS LOCAL LEVEL CONVERTER

- 1120 APPLY HIGH VOLTAGE TO SOURCE OF PMOS TRANSISTOR
- 1130 APPLY BIAS VOLTAGE TO GATE OF PMOS TRANSISTOR
- 1140 APPLY SECTOR SELECT SIGNAL TO GATE OF FIRST NMOS TRANSISTOR
- 1150 APPLY GLOBAL WORD LINE DRIVE VOTAGE TO GATE OF SECOND NMOS TRANSISTOR

1160 APPLY VOLTAGE FROM OUTPUT OF BIASSED LOCAL CONVERTER TO THE WORD LINE DRIVER AND CONCURRENTLY APPLY THE GLOBAL WORD LINE DRIVE VOLTAGE TO THE WORD LINE DRIVER

SEMICONDUCTOR MEMORY DEVICE ROW DECODER STRUCTURES HAVING REDUCED LAYOUT AREA, AND METHODS OF OPERATING THE SAME

This application claims priority from Korean Priority Document No. 2001-28258, filed on May 23, 2001 with the Korean Industrial Property Office, which document is hereby incorporated by reference.

BACKGROUND OF THE INVENTION

1. Field of the Invention

The present invention relates to semiconductor memory devices, and more particularly, to semiconductor memory device row decoder structures having reduced layout area, and methods of operating the same.

2. Description of the Related Art

Semiconductor memory device is generally classified into the volatile and nonvolatile categories.

Volatile memories perform quick read and write operations, but have the disadvantage of being erased, if an external power supply is cut off. These are further classified into dynamic random access memories (DRAMs) and static random access memories (SRAMs).

On the other hand, nonvolatile memories keep the data stored in the memory cells, even if they lose power. These are further classified into mask read only memories (MROMs), programmable read only memories (PROMs) and electrically erasable and programmable read only memory (EEPROMs).

Nonvolatile memories are mainly used for data that should not be lost if the power supply is lost. A result is that, in case of MROMs, PROMs or EEPROMs, common users are not free to perform erase and write (or program) processes. In other words, it is not convenient to erase or re-program the contents programmed at the on-board state. On the contrary, it is possible for the EEPROM system to perform the electrically erase and write processes in itself. Therefore, the EEPROM has been continuously expanded in the applications to be used as a system program storage device, or an auxiliary memory device requiring continuous renewal of its contents.

In other words, it is highly desirable to develop the EEPROM that can be electrically erasable or programmable at high speed, for a variety of electronic devices that can be controlled by computers or microprocessors. Furthermore, since a relatively large area is taken for a hard disk device having a rotary magnetic disk to be used as an auxiliary memory device in a battery powered computer system at the size of a portable computer or notebook computer, designers of such systems have been greatly interested in development of an EEPROM having both a compact size and a high speed operation.

Accordingly, a NOR type flash EEPROM having a flash erase function, appeared along with the advancement of EEPROM design technology, has been welcomed by users who have demanded a high speed memory device including faster programming, write and read operations than those of NAND type or AND type EEPROM.

Referring now to FIG. 1 and FIG. 2, a general structure and a general operation of a NOR-type flash memory device are described.

FIG. 1 shows a vertical cross-section of a memory cell transistor constructing a memory cell unit of a general NOR type flash memory. A n-type source region 3 is formed in p-type substrate 2 (also known as bulk). A n-type drain region 4 (also known as bit line B/L) is formed in p-type substrate 2. Regions 3 and 4 define a channel between them, which has a thin (less than 100 angstroms) insulating layer 5 on it. A floating gate electrode 6 is formed on insulating layer 5, over the channel. An insulating layer 7 is formed over the floating gate electrode 6, and a control gate 8 (which may be called a word line W/L) is formed on insulating layer 7. A gate voltage Vg is applied to control gate 8.

FIG. 2 is a table that indicates levels of voltage to be applied to the device of FIG. 1. These effect different modes of operation, such as program, erase, and read operation modes.

First, the program operation is performed by injection of hot electrons from the drain region 4 and its adjacent channel region to the floating gate electrode 6. Any injected electrons will remain there, even if the device is turned off, which is why the device is nonvolatile.

As shown in the Table 1, an injection of hot electrons is made by applying a high level of voltage, 10V for instance, to the control gate electrode 8 and an adequate level of voltage, 5–6V for instance, to the drain region 4 for generation of hot electrons while the source region 3 and the p-type substrate region 2 are grounded. When enough negative charges are thus accumulated at floating gate electrode 6, the memory cell transistor has a higher level of threshold voltage than that prior to the program operation.

Second, the read operation is performed by applying a level of positive voltage, 1V for instance, to the drain region 4 and a predetermined level of voltage, 4.5V for instance, to the control gate electrode 8 while the source region 3 and the substrate region 2 are grounded.

After the program operation, those of the memory cell transistors having a higher level of threshold voltage function as off-cells during the read operation, to prevent current from flowing from the drain region 4 to the source region 3. In this case, the memory cell transistor is called "an off-cell". At this time, the programmed memory cell transistors generally have voltage distribution at the range of 6 to 7V.

In the NOR type flash memory cell transistor, the erase operation is performed by generating a Fowler-Nordheim tunneling phenomenon (hereinafter referred to as F-N tunneling) from substrate 2 to control gate electrode 8. For creating the F-N tunneling, it is required that a high level of negative voltage, −10V for instance, be applied to the control gate electrode 8, and an adequate level of voltage, 5V for instance, to the bulk region as shown in the table 1. In this case, the drain region 4 is set at high impedance, so that the erase operation is performed effectively. The aforementioned conditions of the erase operation form a strong magnetic field between the control gate electrode 8 and the bulk region, which bring about the F-N tunneling. Accordingly, any negative charges stored in floating gate electrode 6 are discharged to source region 3. The F-N tunneling is commonly known to happen when the magnetic field of 6 to 7 MV/cm is applied to the conductive layer between the insulating layers. Even in the aforementioned memory cell transistor, the gate insulating layer 7 is formed in the thickness of 100 angstroms to permit the F-N tunneling to happen. As a result of the erase operation, the level of threshold voltage becomes lower at the memory cell transistor, than that of the case that electric charges are accumulated at the floating gate electrode 6.

During the read operation, the memory cell having the level of threshold voltage lowered by the erase operation functions as an on-cell, because of a current path from a drain region to a source region along the channel. At this time, the memory cell transistor is called an on-cell. The threshold voltage of the erased memory cell transistors is in the range of approximately 1V to 3V.

In the general flash memory, many cells are formed in the bulk region for high integration. Moreover, they are connected, so that they can be erased simultaneously, during the aforementioned erase operation. These cells are also divided in regions, each of which has an erase unit. For instance, a group of memory cells that can be electrically erased as a unit of 64K byte are together called a sector.

FIG. 3 shows a memory cell array in the prior art. In fact, FIG. 3 is made from FIG. 3A and FIG. 3B, which are considered joined at their common numerals.

In FIG. 3, each of the word lines WLi is commonly connected to gates of n memory cells. Each of the bit lines BLi is commonly connected to drains of m cells.

A plurality of unit sectors of 64 K byte are formed, and a core block has a row decoder for selectively driving word lines of the unit sectors. If the unit sector in the memory cell array is of 64 K byte, the number of word lines W/L is generally 1024 and the number of bit lines is 512.

The memory device of FIG. 3 includes a plurality of sectors 300–300n that form a memory cell array.

For each such sector, the device of FIG. 3 includes sector selectors 10–10n, for inputting a select signal to select one out of the sectors; level shift drivers 21–21n; high voltage drivers 30–30n; and erase voltage drivers 40–40n for applying a voltage necessary in driving a plurality memory cell transistors in the sectors.

The device of FIG. 3 further includes global row decoders 800–800n commonly connected to the sectors for row decoding, partial decoders 50–50n arranged in each of the sectors; and local row decoders 900–900n, 910–910n, ..., 930–930n correspondingly connected to global row decoders 800–800n for selecting word lines.

In the aforementioned structure, 10 row address signals are needed in selecting one W/L out of 1024 W/Ls at the selected selector during reading or programming operation. The ten address signals are divided into two groups, one with 7 signals and one with 3 signals. The seven signals serve to drive one of the 128 global row decoders 800–800n, to select one global word line (GWLi; i=0 to 127). The three address signals serve to drive one of the partial decoders 50–50n assigned to each of the sectors to thereby select one partial word line (PWLi; i=0 to 7).

The global word lines (GWL0 to GWL127) are correspondingly connected to the local row decoders 900–900n, 910–910n, ..., 930–930n. The local row decoder of the selected sector receives a signal of the enabled one of the eight partial word lines (PWLi; i=0 to 7) by the selected partial decoder. Therefore, one word line W/L connected to control gates of memory cells is selected.

As shown in FIG. 3, each of the plurality of local row decoders 900–900n, 910–910n, ..., 930–930n has a respective level shifter LSpq, where p, q take appropriate values. These are driven by the level shift drivers 21–21n.

The level shifters LSij are for switching from a low voltage to a high voltage. That is because the plurality of local row decoders 900–900n, 910–910n, ..., 930–930n should receive a relatively low level of signal of the global word line GWLi, and output to the selected word line W/L a high voltage that is larger than power supply voltage.

Level shifter LS1 is comprised of a NAND gate N1 for NAND-gating a signal of global word line GWL0 and a sector select signal; first and second PMOS transistors P1, P2 that are cross-coupled; a first input NMOS transistor N3 connected to a gate of the second PMOS transistor P2 at its drain, and connected to an output of the of the NAND gate at its source; and a second input NMOS transistor N2 connected to a gate of the first PMOS transistor P1 at its drain, and connected to an output of the of the NAND gate N1 at its gate.

According to such a structure, the signal of the global word line GWL0 and the select signal SS0 of sector selector 10 are NAND-gated, and the result is input to a gate of second input NMOS transistor N2. On the other hand, the signal of level shift driver 21 is input to a gate of first input NMOS transistor N3. The differential amplification signals that are amplified by difference in a voltage level of gate inputted to the first and second input NMOS transistors N3, N2 are generated as an output signal of the level shifter, through the drain terminals of first and second PMOS transistors P1, P2. The level-shifted output of the level shifter is applied to the word line driver DR1, which is connected to the corresponding word line to thereby boost the selected word line to a high voltage.

At this time, since the level shifters arranged in the local row decoders 900 to 900n, 910 to 910n, ..., 930 to 930n should have NAND gates formed with a plurality of transistors, there has been a problem that the area occupied by the local row decoders must be increased. Furthermore, since all the internal transistors other than the NAND gates are made by devices for a high voltage, accordingly large transistors should be fabricated, that have a relatively large channel size and forming separate wells. With design requirements like these, however, it is difficult to reduce a chip size in view of the process aspect and layout aspect.

As describe above, there has been a problem in the prior art in that the layout area is large, which in turn hinders higher integration of semiconductor memory devices.

SUMMARY OF THE INVENTION

The invention improves on the limitations of the prior art. The invention provides semiconductor memory device row decoder structures having reduced layout area, and methods of operating the same.

A method according to an embodiment of the invention is for erasing memory cells coupled to a single bitline. A local level converter is biased, for powering in turn a component of a word line driver. In addition, a global word line driver powers another component of the word line driver.

An advantage of the method of the invention is that an existing component (i.e. the global word line driver) is used to power a portion of the word line driver. This way the local level converter has fewer design requirements, than a level shifter of the prior art.

A structure according to an embodiment of the invention is for erasing memory cells coupled to a single bitline. The structure includes a single bias driver for these cells, and a plurality of local voltage level converters coupled to the bias driver. At least one word line driver is coupled to each local level converter, to erase at least one of the memory cells.

Each level converter of the invention has a simpler structure than the level shifter of the prior art, and therefore occupies less area. Furthermore, it may be made with smaller transistors, further conserving on the layout area. The savings are then multiplied by the large number of the local level converters, which results in significant savings in the overall area of the chip.

BRIEF DESCRIPTION OF THE DRAWINGS

The advantages of the present invention will become apparent by describing in detail preferred embodiments thereof with reference to the attached drawings in which:

FIG. 5 is a table showing operational modes of the device of FIG. 4.

FIG. 11 is a flowchart for illustrating a method according to the present invention.

DETAILED DESCRIPTION OF PREFERRED EMBODIMENTS

Figures 1, 2:
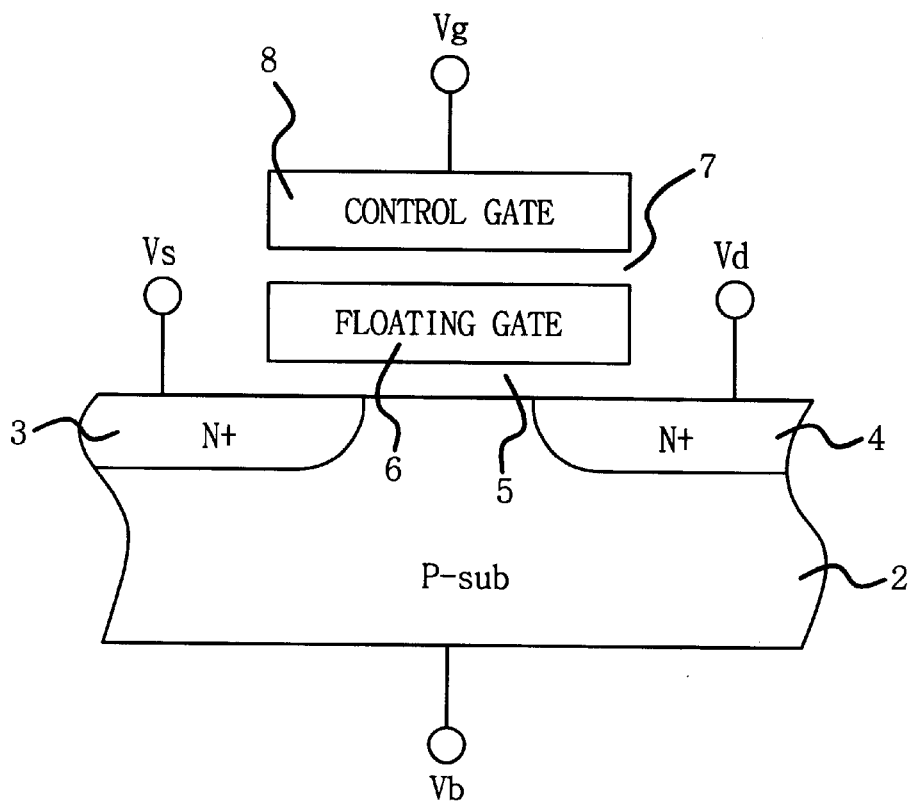
FIG. 1 is a cross sectional view showing the section structure of a NOR type memory cell transistor in the prior art.
FIG. 2 is a table showing operational modes of the device of FIG. 1.

Hereinafter, the present invention will be described in detail with reference to the accompanying drawings. It should be noted that like reference numerals are used through the accompanying drawings for designation of like or equivalent parts or portion for simplicity of illustration and explanation. Also, in the following description, specifications will be made to provide a thorough understanding about the present invention. It is apparent to one skilled in the art that the present invention can be achieved without the specifications. There will be omission of detailed description about well known functions and structures, so that the description of key points of the present invention will not be obscured.

Figure 4:
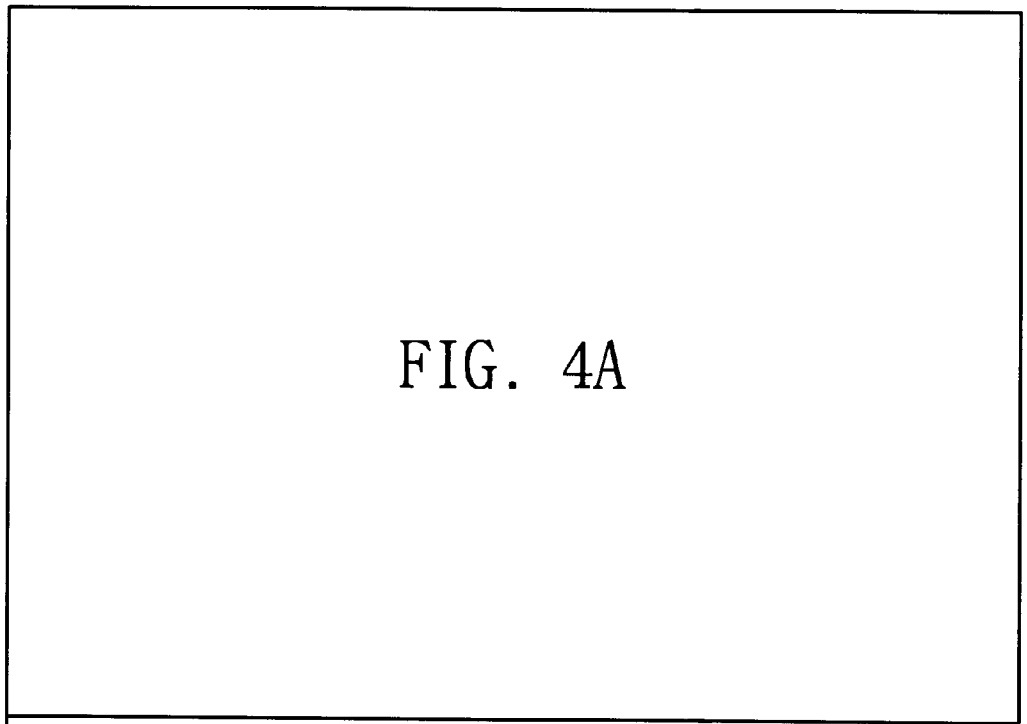
FIG. 4 (made from FIG. 4A and FIG. 4B) is a circuit diagram showing a sector and row decoder structure of a NOR type flash memory according to an embodiment of the present invention.
Figure 4:
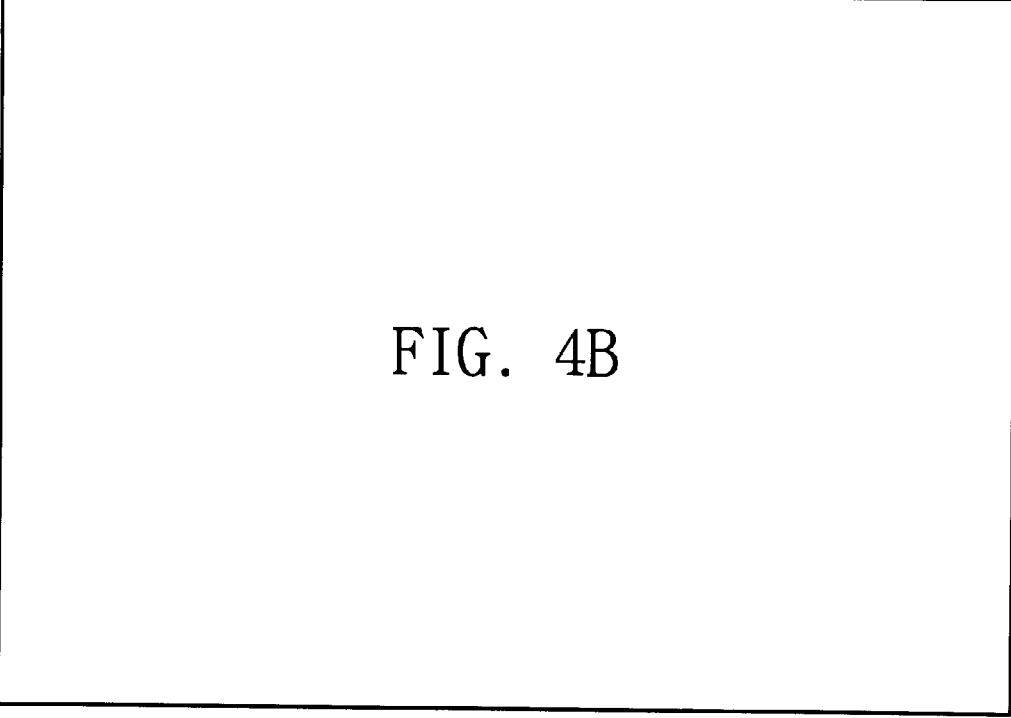
Figure 4A:
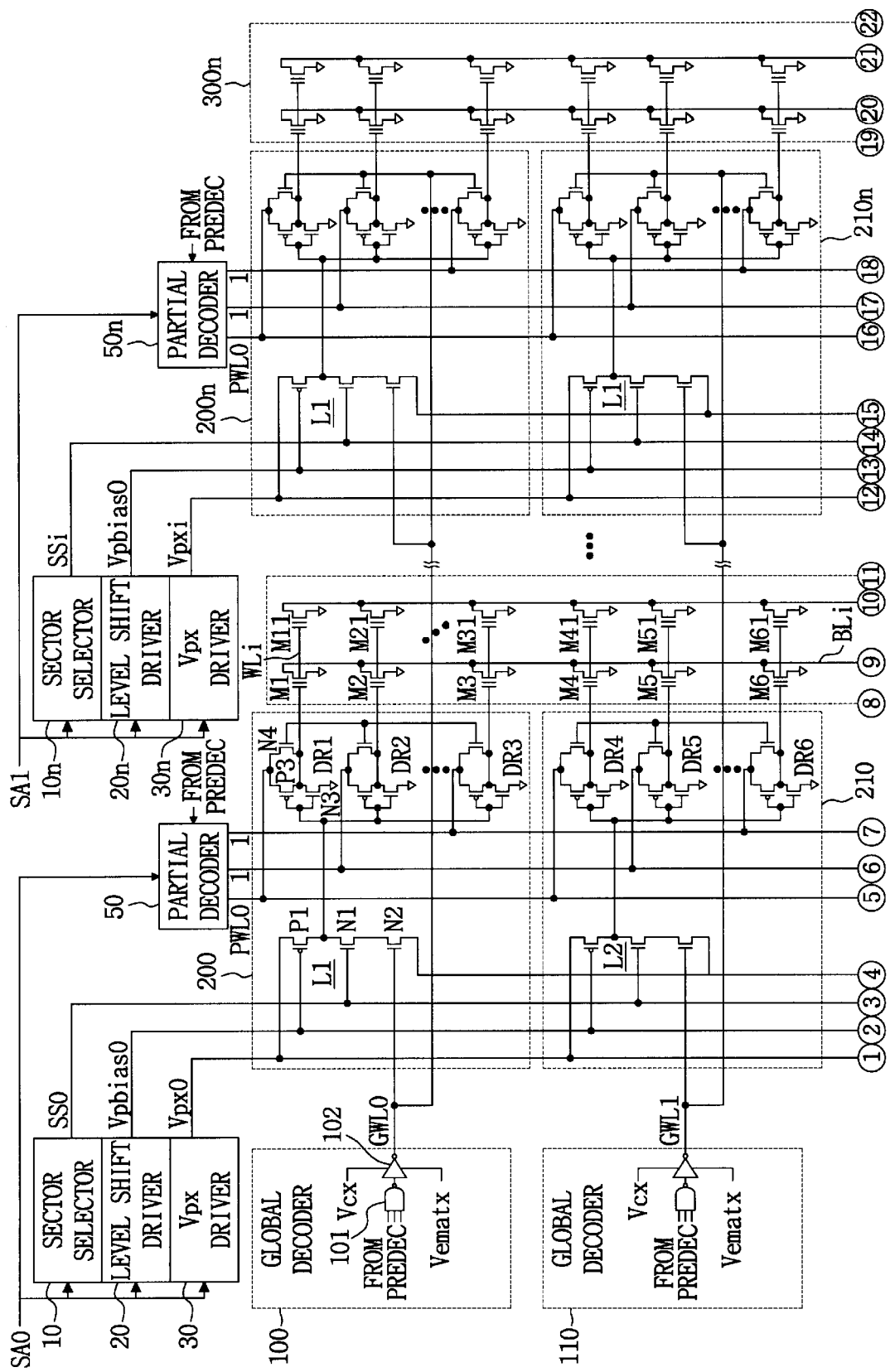
Figure 4B:
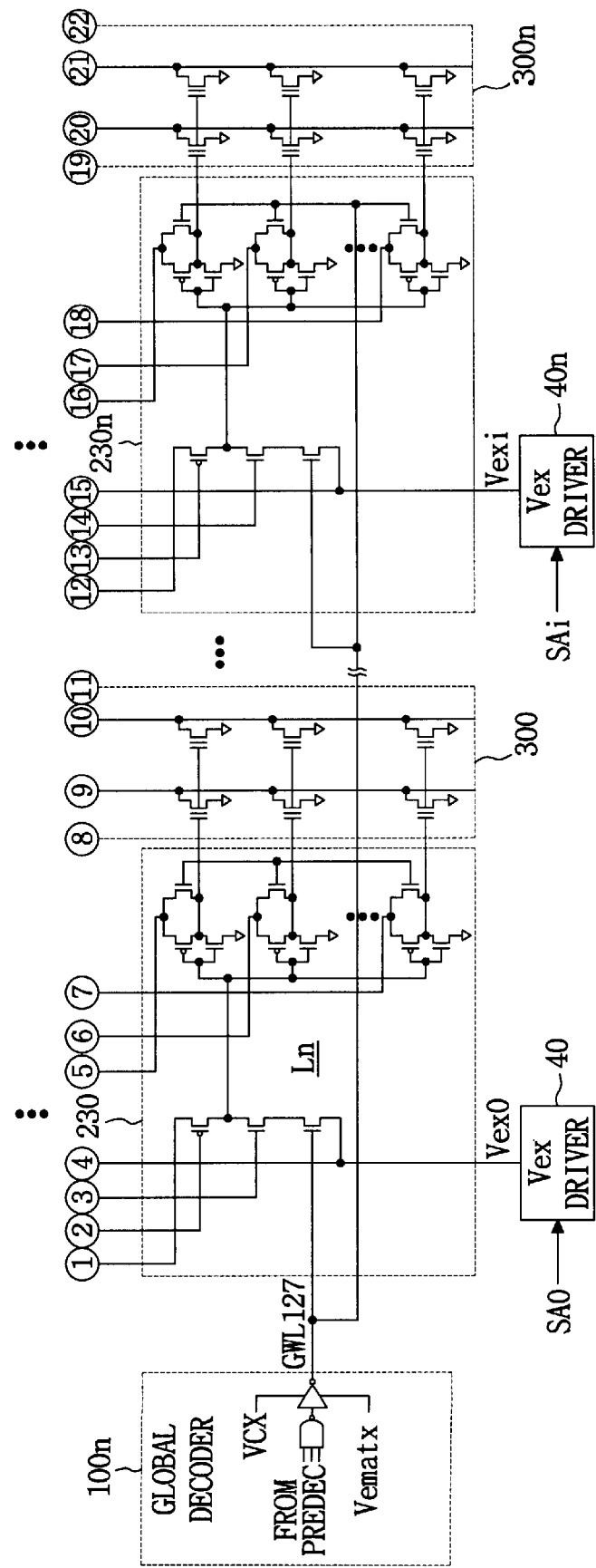

FIG. 4 shows a sector and row decoder connection structure of a NOR type flash memory according to an embodiment of the present invention. In fact, FIG. 4 is made from FIG. 4A and FIG. 4B, which are considered joined at their common numerals.

In FIG. 4, only a portion of the core block including the row decoder is shown; it should be understood that various functional blocks for a memory operation are omitted, so as not to obscure the description of the invention.

The structure of FIG. 4 includes a plurality of sectors 300–300n. These include memory cell transistors that are connected to corresponding word lines at their gates, and to corresponding bit lines at their drains.

The structure of FIG. 4 also includes global row decoders 100, 110, . . . , 100n. Global row decoders 100, 110, . . . , 100n decode a portion of address signals out of external address signals, to select global word lines.

The structure of FIG. 4 further includes partial decoders 50–50n arranged in each of the sectors. Partial decoders 50–50n decode the remaining address signals out of the external address signals to thereby select partial word lines.

The structure of FIG. 4 moreover includes local row decoders 200–200n, 210–210n, . . . , 230–230n connected to the global word lines of the global row decoders 100, 110, . . . , 100n. Local row decoders 200–200n, 210–210n, . . . , 230–230n receive a drive voltage of word line through the partial word lines, to thereby enable the word lines of the selected sectors.

The structure of FIG. 4 additionally includes high voltage Vpx drivers 30–30n. High voltage Vpx drivers 30–30n generate a high voltage Vpx, to input it to local row decoders 200–200n, 210–210n, . . . , 230–230n in response to the sector address signal.

The structure of FIG. 4 also includes erase voltage Vex drivers 40–40n. Erase voltage Vex drivers 40–40n generate an erase voltage Vex, to input it to the local row decoders 200–200n, 210–210n, . . . , 230–230n in response to the sector address signal.

The structure of FIG. 4 further includes sector selectors 10–10n. Sector selectors 10–10n generate a sector select signal, to input it to the local row decoders 200–200n, 210–210n, . . . , 230–230n in response to the sector address signal.

The structure of FIG. 4 additionally includes bias drivers 20–20n. Bias drivers 20–20n generate a bias voltage, to apply it to the local row decoders 200–200n, 210–210n, . . . , 230–230n in response to the sector address signal.

Each of global row decoders 100, 110, . . . , 100n includes a logic gate 101 for gating the address signals using the external power supply voltage as a drive voltage, and an inverter 102 for inverting an output from the logic gate. Inverter 102 thus outputs a global word line drive voltage.

Inverter 102 is supplied with the first voltage Vcx or second voltage Vematx as a drive voltage for operation. The first voltage Vcx is 0V during an erase operation, and a level of an external power voltage during the other modes. Meanwhile, the second voltage Vematx is a negative high-voltage during an erase operation, and a level of 0 V during the other modes.

Each of local row decoders 200–200n, 210–210n, . . . , 230–230n receives a high voltage Vpx and an erase voltage Vex, as driving power voltages. These voltages VPex, Vex are supplied from Vpx drivers 30–30n and Vex drivers 40–40n, respectively.

Each of the local row decoders 200, 210, . . . , 230 includes a local level converter L1, L2, . . . Ln. Similarly, each co the remaining local row decoders includes local level converters (unnumbered in FIG. 4). They also includes word line drivers DR1 connected to their respective local level converter.

As shown in FIG. 4, local level converter L1 includes a PMOS transistor P1. Transistor P1 of FIG. 4 receives a high voltage at its source, and a bias voltage Vpbiasi at its gate.

Local level converter L1 also includes an NMOS transistor N1 having a drain coupled with a drain of PMOS transistor P1. Transistor N1 receives a sector select signal SSi at its gate.

Local level converter L1 further includes a second NMOS transistor N2 having a drain coupled with a source of the first NMOS transistor N1. Transistor N2 has a gate coupled with the global word line.

The converted output level of local level converter L1 is applied to the word line drivers DR1, DR2, DR3. As will be seen, word line driver DR1 is coupled with a corresponding word lines, so that the selected word line may be boosted to a high voltage.

In particular, word line driver DR1 includes a PMOS transistor P3. Transistor P3 has a source coupled with partial word line PWLi, a gate receiving an output of the local level converter L1, and a drain coupled with word line WLi.

Word line driver DR1 also includes an NMOS transistor N3. Transistor N3 has a drain coupled with the drain of the PMOS transistor P3, a grounded source, and a gate receiving an output of the local level converter L1.

Word line driver DR1 further includes an NMOS transistor N4. Transistor N4 has a drain coupled with the partial word line, a gate coupled with global word line GWLi, and a source coupled with word line WLi.

Figure 3A:
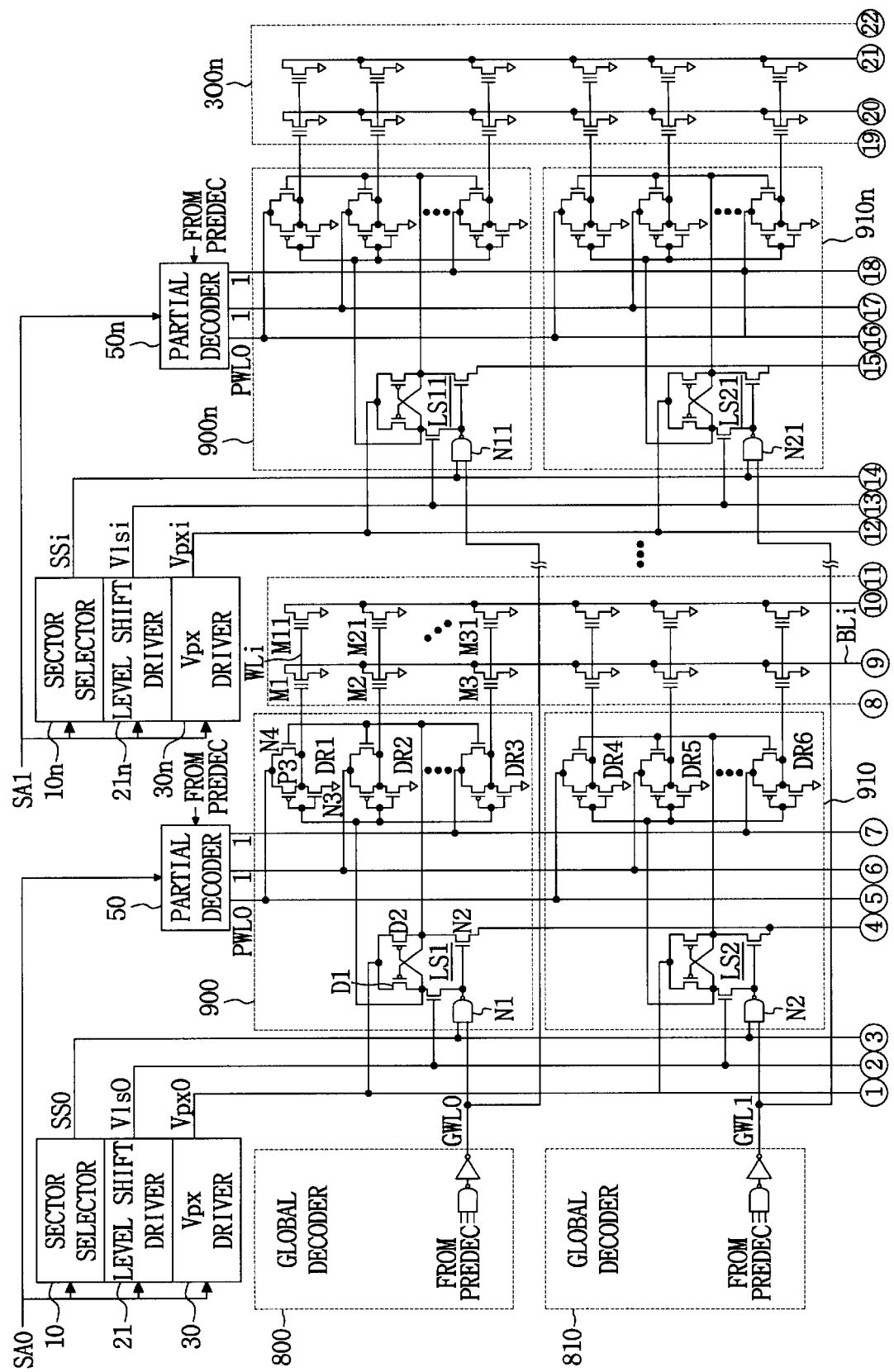
FIG. 3 (made from FIG. 3A and FIG. 3B) is a circuit diagram showing a sector and row decoder structure of a general NOR type flash memory in the prior art.
Figure 3B:
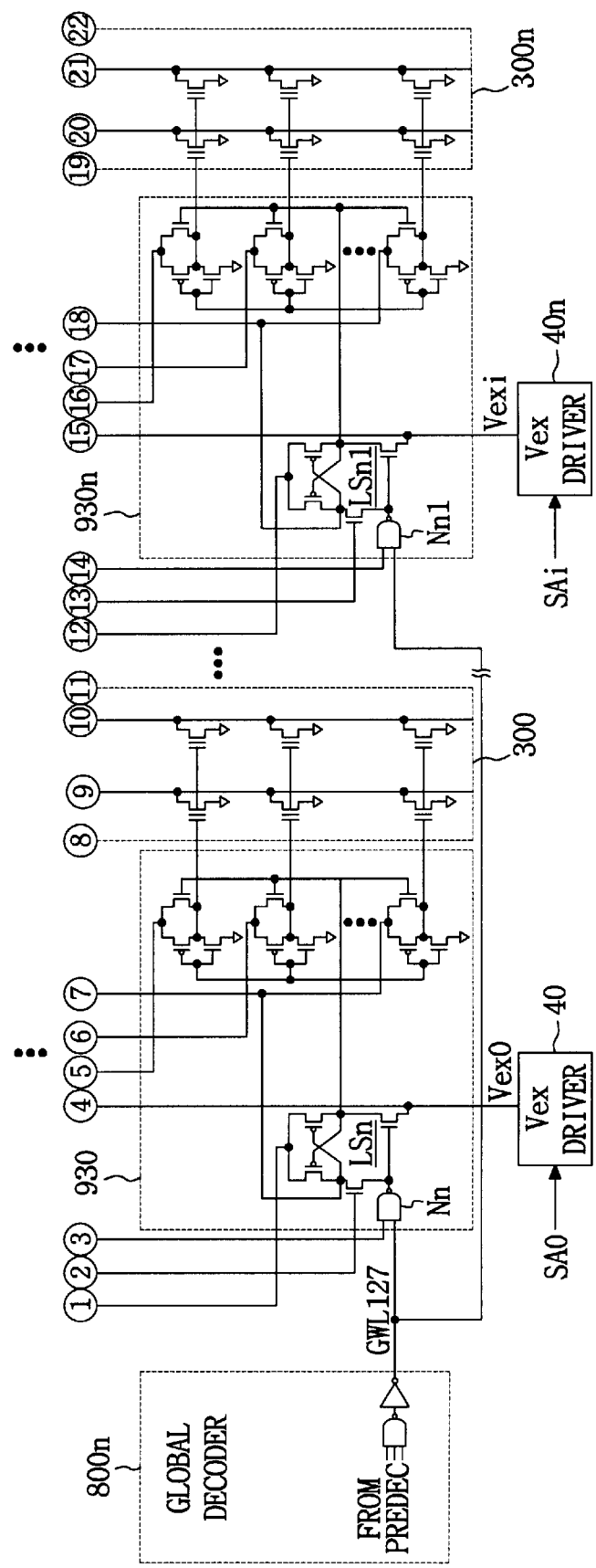

A contrast of FIG. 4 with the prior art of FIG. 3 is useful at this juncture. Local level converter L1 of the invention has a simpler structure. That is because, since the wordline driver receives an input also from global word line GWLi, local level converter L1 does not need to perform a differential amplification operation.

Local level converter L1 of the invention can perform a level converting operation, without even needing the NAND gates of level shifter LSpq shown in FIG. 3. Accordingly, level converter L1 of the invention requires substantially less area from level shifter LSpq of the prior art.

Moreover, due to the reduced design requirements, local level converter L1 of the invention may be made with smaller transistors than those of level shifter LSpq. This further reduces the layout area for each of the local row decoders 200–200n, 210–210n, . . . , 230–230n.

A massive savings in area therefore results from the invention. The savings in area described above for one local row decoder, are to be multiplied by the large number of the local row decoders 200–200n, 210–210n, . . . , 230–230n. For example, if a sector is set at a capacity of 64 K byte, made out of 1024 W/L and 512 B/L, the multiplication is by the resulting numbers of both rows and columns.

Referring also to FIG. 5, the row decoding operation for the structure of FIG. 4 is explained below. FIG. 5 is a table that shows the applied voltages versus the operational modes. The structure of FIG. 4 is assumed to be made by 1024 wordlines (W/L) and 512 bitlines (B/L).

Ten (10) row address signals are needed in selecting one W/L out of 1024 W/Ls at the selected sector during reading or programming operation. The ten address signals are divided into two groups, one of 7 signals and one of 3 signals.

The seven signals serve to drive one of the 128 global row decoders 100, 110, . . . , 100n. This selects one of the global word line (GWLi; i=0 to 127).

The three address signals serve to drive one of the partial decoders 50–50n assigned to each of the sectors. This way, one of the partial word lines (PWLi; i=0 to 7) is selected.

The global word lines (GWL0 to GWL127) are correspondingly coupled with the local row decoders 200–200n, 210–210n, . . . , 230–230n. The local row decoder of the selected sector receives a signal of the enabled one (out of the eight) partial word line (PWLi; i=0 to 7) by the selected partial decoder. Accordingly, that one W/L connected to control gates of memory cells is selected during a read operation or during a program operation.

Global row decoders 100, 110, . . . , 100n receive a second voltage Vematx as a drive power voltage during an erase operation. The second voltage Vematx is supplied as a negative high voltage, -10 V for instance, during an erase operation.

Erase voltage Vex drivers 40–40n are activated in response to the sector address, thereby inputting an erase voltage Vexi (for instance 10V), to the local level converter of the selected sector. The SSi, Vpxi and PWLi are supplied with 0V, and the Vpbiasi is supplied with a negative high voltage (for instance, -10V).

Accordingly, the output of the local level converter in the local row decoder of the selected sector becomes 0V. Therefore all the W/Ls of the selected sector are supplied with the negative high voltage, and the output of the local level converter in the local row decoder of the non-selected sector becomes a negative high voltage. This causes all the W/Ls of the non-selected sector to be supplied with 0V.

Figure 6:
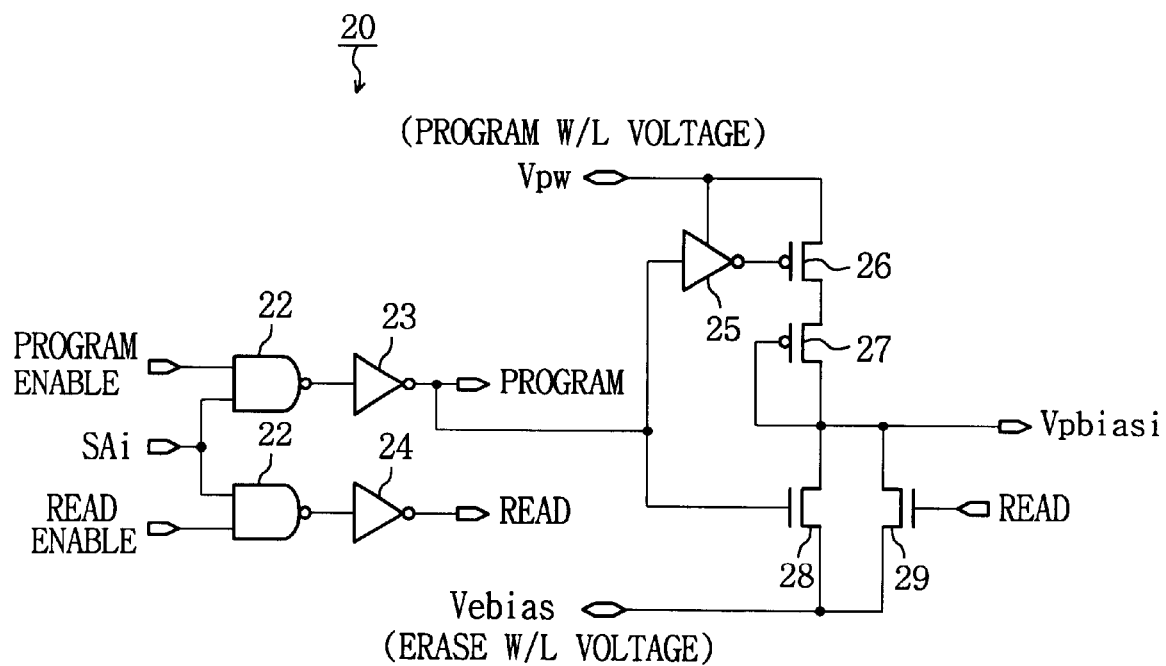
FIG. 6 is a circuit diagram of the Vpbias driver shown in FIG. 4.

FIG. 6 is a circuit diagram of the Vpbias driver 20 shown in FIG. 4. Driver 20 comprises NAND gate 22, inverters 23, 24 for inverting the outputs of NAND gates 22, an inverter 25 for inverting a program signal, a PMOS transistor 26 connected to an output of inverter 25 at its gate, a PMOS transistor 27 connected to a drain of PMOS transistor 26 at its source, an NMOS transistor 28 receiving a program signal at its gate and connected between the bias terminal and the drain of the transistor 27 by its drain-source channel, and an NMOS transistor 29 receiving the output of inverter 24 through its gate and in parallel connected to NMOS transistor 28.

In the structure shown in FIG. 6, a program enable signal is input to one side of NAND gate 22 as a logic "high" during a programming operation. In case that the corresponding sector is selected, the sector address SAi is applied as a logic "high" to other input terminals of NAND gates 22. Accordingly, inverter 25 serves to apply a low level to a gate of PMOS transistor 26, while NMOS transistor 28 is also turned on. As a result, the output signal Vpbiasi from the drain terminal of PMOS transistor 27 is determined as a voltage level of Vpw-Vtp. In this determination, Vpw is a voltage supplied to a word line during a program operation, and Vtp is a threshold voltage of PMOS transistors 26, 27.

On the other hand, in a read operation, a read enable signal becomes a logic "high". In case that the corresponding sector is selected, the sector address SAi is applied as a logic "high". Accordingly, the output of the inverter 24 becomes "high", turning on NMOS transistor 29. As a result, output signal Vpbiasi from the drain terminal of PMOS transistor 27 becomes 0V. In addition, in an erase operation, since the erase bias voltage Vebias is applied as a negative high voltage (e.g. -10V), the output voltage Vpbiasi becomes the same voltage as the erase bias voltage Vebias (e.g. -10V).

Figure 7:
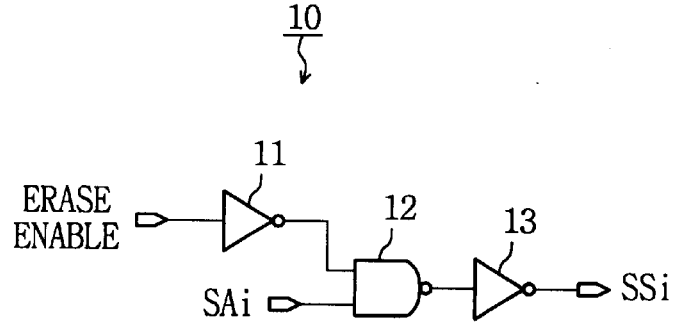
FIG. 7 is a circuit diagram of the sector selector as shown in FIG. 4.

FIG. 7 is a circuit diagram of one of the sector selectors 10–10n shown in FIG. 4. Circuit 10 comprises an inverter 11 for inverting an erase enable signal, a NAND gate 12 for receiving the output of the inverter 11 and the sector address SAi to thereby generate a NAND response, and an inverter 13 for inverting the output of the NAND gate 12.

The operation of the sector selector 10 is as follows. During an erase operation, the output signal SSi of inverter 13 becomes "low", regardless of whether a sector is selected or not. If the sector had been selected at the previous time of a non-erase operation, the output SSi becomes "high", but if the sector had not been selected, the output SSi becomes "low".

Figure 8:
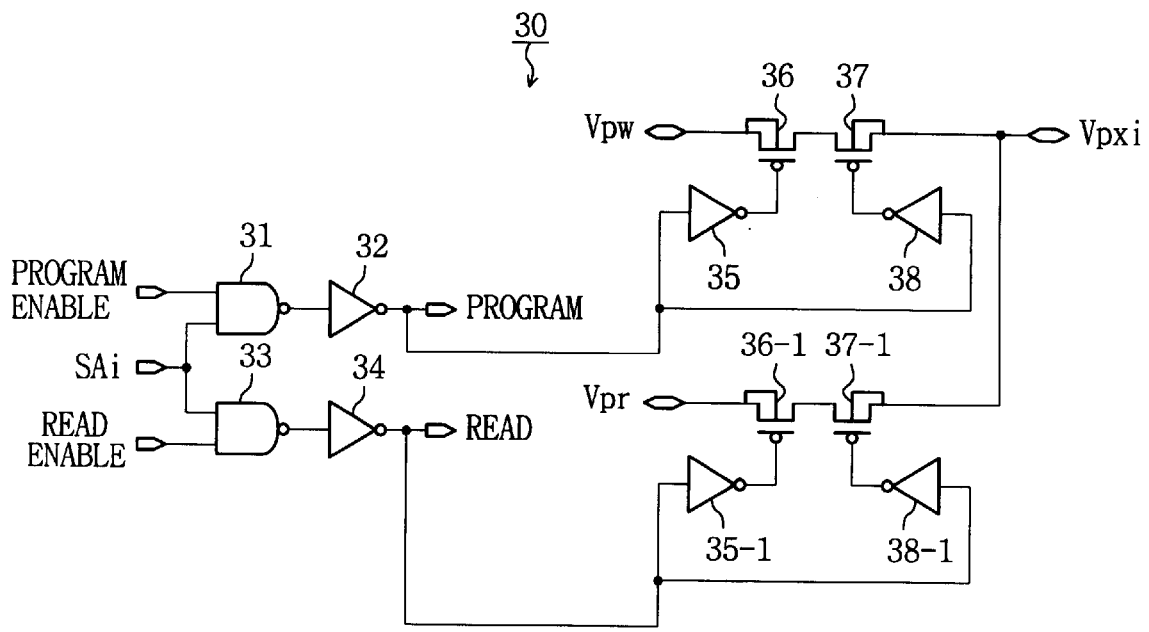
FIG. 8 is a circuit diagram of the Vpx driver as shown in FIG. 4.

FIG. 8 is a circuit diagram of the Vpx driver 30 shown in FIG. 4. Driver 30 comprises NAND gates 31, 33, inverters 32, 34 for inverting the outputs of NAND gates 31, 33, inverters 35, 38 for inverting a program signal that is output from inverter 32, PMOS transistors 36, 37 connected to outputs of inverters 35, 38 at its gates, inverters 35-1, 38-1 for inverting a read signal that is output from inverter 34, and PMOS transistors 36-1, 37-1 connected to outputs of inverters 35-1, 38-1 at its gates.

During a read operation, the read enable signal is applied to the driver circuit 30 as "high". In the case of the selected sector, the read signal is input as "high", and the voltage Vpr that is applied to the source of the PMOS transistor 36-1 is output through the output terminal Vpxi.

During a program operation, since the program enable signal is input as "high", the program signal becomes "high" in the case of the selected sector, and the voltage Vpw appears at the output terminal Vpxi.

Figure 9:
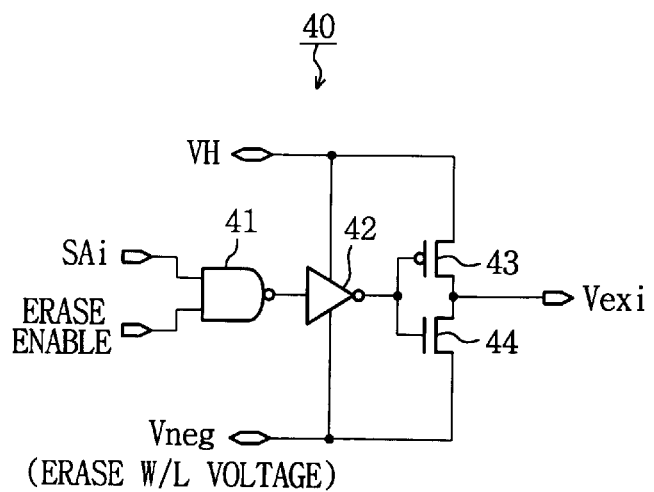
FIG. 9 is a circuit diagram of the Vex driver as shown in FIG. 4.

FIG. 9 is a circuit diagram of the Vex driver 40 shown in FIG. 4. Driver 40 comprises a NAND gate 41, an inverter 42, and an inverter comprised of a combination of P type MOS transistor 43 and N type MOS transistor 44. In this case, the erase signal becomes "high", and in case of the selected sector, the voltage that is applied to the terminal Vneg is transmitted to the terminal Vexi.

Figure 10:
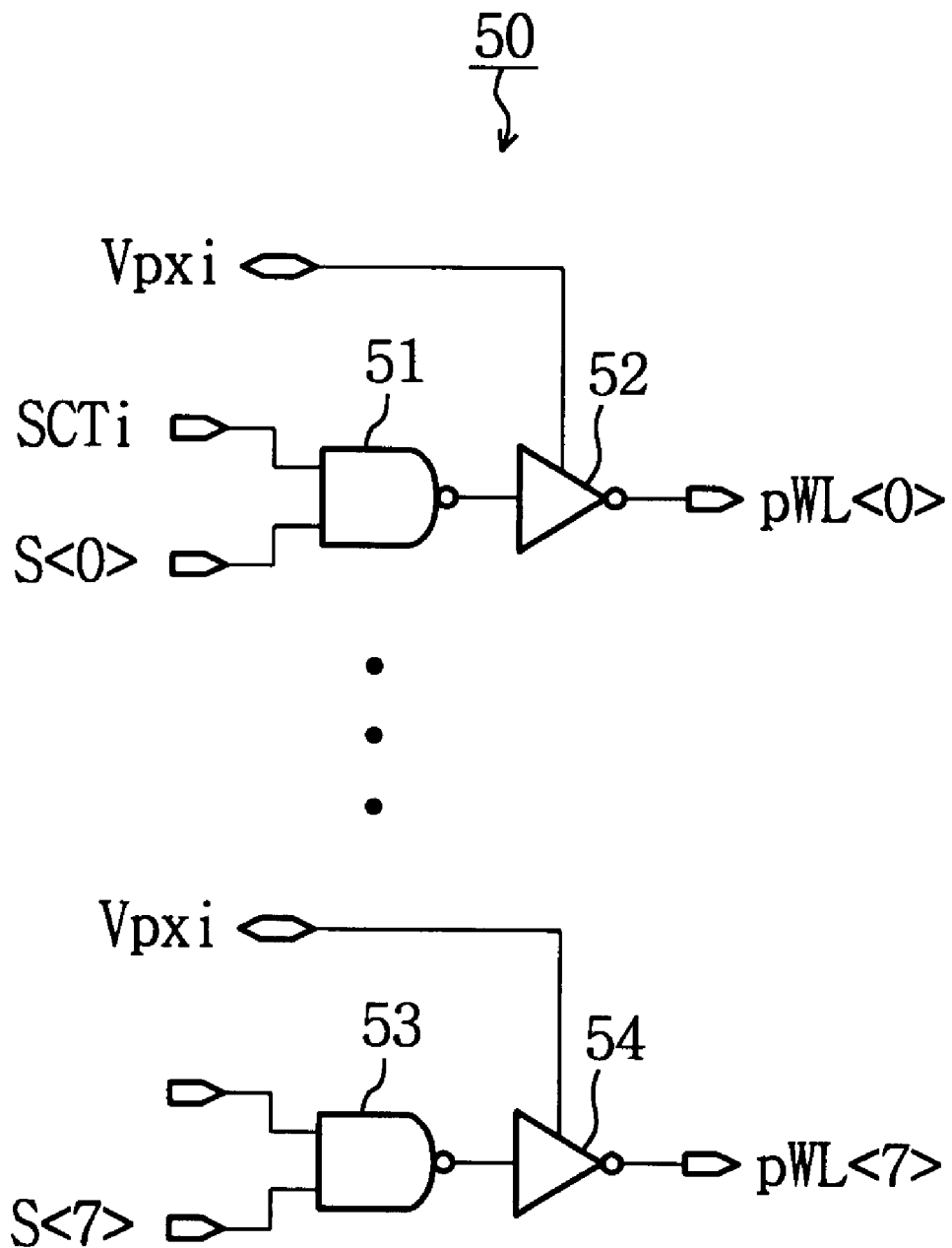
FIG. 10 a circuit diagram of the partial decoder shown in FIG. 4.

FIG. 10 is a circuit diagram of the partial decoder 50 shown in FIG. 4. Partial decoder 50 includes a NAND gate 51 and an inverter 52 to enable the corresponding partial word line pWL<0>, and NAND gate 53 and inverter 54 for pWL<7>, etc. When the selector is selected and the signal S<i> generated by the three address signals is "high", the voltage level is transmitted to the output terminal pWL<i>.

Referring now to FIG. 11, a flowchart 1100 is shown for describing a method according to an embodiment of the invention. The method of flowchart 1100 may also be practiced by the device of FIG. 4. It will be understood that, although many of the boxes are given sequentially, many of them may optionally be performed concurrently.

The method of flowchart 1100 is for driving a word line of an electrically programmable and erasable semiconductor memory device, which has a local level and a word line driver coupled to the local level converter and to the word line.

According to a box 1110, the local level converter is biased.

According to a box 1160, a voltage from an output of the biassed local level converter is applied to the word line driver. In addition, a voltage from a global word line is concurrently applied to the word line driver to drive the word line.

In the preferred embodiment, the local level converter is made of a PMOS transistor and first and second NMOS transistors, and the output of the local level converter is a drain of the PMOS transistor. Then, box 1110 is performed as follows.

According to a box 1120, a high voltage is applied to a source of a PMOS transistor.

According to a box 1130, a bias voltage is applied to a gate of the PMOS transistor.

According to a box 1140, a sector select signal is applied to a gate of a first NMOS transistor.

According to a box 1150, the global word line drive voltage is applied to a gate of a second NMOS transistor.

While the invention has been described in terms of preferred embodiments, those skilled in the art will recognize that the invention can be practiced with modification within the sprit and scope of the appended claims. For example, the local row decoder of the present invention may be applied to even a nonvolatile semiconductor memory having NAND or AND structure. In addition, the logic gates may be replaced with the corresponding equivalent circuit devices or other logic devices.

The invention claimed is:

1. A local row decoder structure of a nonvolatile semiconductor memory device to erase memory cells coupled to a single bitline, comprising:
   a single bias driver;
   a plurality of local level converters coupled with the bias driver, wherein one of the local level converters includes:
      a PMOS transistor having a source for receiving a high voltage and a gate for receiving a bias voltage from the bias driver,
      a first NMOS transistor having a drain coupled to a drain of the PMOS transistor and a gate for receiving a sector select signal, and
      a second NMOS transistor having a drain coupled to a source of the first NMOS transistor and a gate coupled to the global word line; and
   at least one word line driver coupled to each local level converter to erase at least one of the memory cells, the word line driver being coupled to the local level converter and to a global word line.

2. The structure of claim 1, in which the word line driver comprises:
   a PMOS transistor having a source coupled with a partial word line, a gate for receiving an output of the local level converter, and a drain coupled to a word line;
   an NMOS transistor having a drain coupled with the drain of the PMOS transistor, a grounded source, and a gate for receiving the output of the local level converter; and
   an NMOS transistor having a drain coupled with the partial word line, a gate coupled with the global word line, and a source coupled with the drain of the PMOS transistor.

3. The structure of claim 1, in which
   the nonvolatile semiconductor memory device is a NOR type flash EEPROM.

4. A local row decoder structure of a nonvolatile semiconductor memory device to erase memory cells coupled to a single bitline, comprising:
   a plurality of local level converters, at least one of the local level converters including
      a PMOS transistor having a source for receiving a high voltage, a gate for receiving a bias voltage, and a drain,
      a first NMOS transistor having a drain coupled to the drain of the PMOS transistor, a gate for receiving a sector select signal, and a source, and
      a second NMOS transistor having a drain coupled to a source of the first NMOS transistor and a gate coupled to a global word line; and
   at least one word line driver coupled to each local level converter to erase at least one of the memory cells.

5. The structure of claim 4, in which the word line driver comprises:
   a PMOS transistor having a source coupled with a partial word line, a gate for receiving an output of the local level converter, and a drain coupled to a word line;
   an NMOS transistor having a drain coupled with the drain of the PMOS transistor, a grounded source, and a gate for receiving the output of the local level converter; and
   an NMOS transistor having a drain coupled with the partial word line, a gate coupled with a global word line, and a source coupled with the drain of the PMOS transistor.

6. The structure of claim 4, in which
the nonvolatile semiconductor memory device is a NOR type flash EEPROM.

7. A semiconductor memory device for programming and erasing memory cells, comprising:
sectors including a plurality of memory cell transistors that are connected to corresponding word lines at their gates, and connected to corresponding bit lines at their drains;
global row decoders for decoding a first portion of address signals to thereby select at least one of the global word lines;
partial decoders arranged in each of the sectors to decode a second portion of the address signals to thereby select at least one of partial word lines;
local row decoders coupled with the global word lines for receiving a drive voltage of word line through the partial word lines to thereby enable at least one of the word lines wherein one local row decoders includes:
a PMOS transistor having a source for receiving a high voltage and a gate for receiving a bias voltage from a bias driver,
a first NMOS transistor having a drain coupled to a drain of the PMOS transistor and a gate for receiving the sector select signal, and
a second NMOS transistor having a drain coupled to a source of the first NMOS transistor and a gate coupled to one of the global word lines;
high voltage drivers for generating a high voltage to thereby input it to the local row decoders in response to a sector address signal;
erase voltage drivers for generating an erase voltage to thereby input it to the local row decoders in response to a sector address signal;
sector selectors for generating a sector select signal to input it to the local row decoders in response to the sector address signal; and
bias drivers for generating a bias voltage to apply it to the local row decoders in response to the sector address signal.

8. An electrically programmable and erasable semiconductor memory, comprising:
sectors comprising a plurality of word lines, a plurality bit lines and a plurality of memory cells;
global row decoders including a logic part for receiving a decoding signal generated in response to an external address signal and for selecting a selected global word line, the global row decoder receiving an output of the logic part as an input, the global row decoder connected between a first power voltage terminal and a second power voltage terminal to output the first or second power voltage to a global word line;
partial row decoders receiving an address of the global row decoder and a decoding signal generated in response to an external address signal, the partial decoder outputting a third power voltage to a selected partial word line;
a sector select driver receiving a decoding signal and a control signal generated by the external address signal to output the selected sector signal;
a bias driver receiving a decoding signal generated by the external address signal, the bias driver connected to between a fourth power voltage and a fifth power voltage terminal to output a fourth voltage and fifth voltage as a bias voltage;
a high voltage driver receiving the decoding signal and a control signal generated in an internal, the high voltage driver connected between a sixth power voltage and a seventh power voltage to selectively output a sixth power voltage and a seventh power voltage;
an erase voltage driver receiving the decoding signal and an internal control signal, the erase voltage driver connected between a eighth power voltage and a ninth power voltage to selectively output a eighth power voltage and a ninth power voltage; and
a local row decoder receiving the sector select signal, bias voltage, high voltage, erase voltage, partial word line voltage, and global word line voltage to select one word line.

9. The structure of claim 8, in which
the nonvolatile semiconductor memory device is a NOR type flash EEPROM.

10. A method for driving a word line of an electrically programmable and erasable semiconductor memory device having a local level converter, and a word line driver coupled to the local level converter and to the word line, the method comprising:
biasing the local level converter;
applying a voltage from an output of the biased local level converter to the word line driver; and
concurrently applying a voltage from a global word line to the word line driver to drive the word line.

11. The method of claim 10, in which
the local level converter is made of a PMOS transistor and first and second NMOS transistors,
the output of the local level converter is a drain of the PMOS transistor, and biasing the local level converter includes
applying a high voltage to a source of the PMOS transistor;
applying a bias voltage to a gate of the PMOS transistor;
applying a sector select signal to a gate of the first NMOS transistor; and
applying the global word line drive voltage to a gate of the second NMOS transistor.

* * * * *

UNITED STATES PATENT AND TRADEMARK OFFICE
CERTIFICATE OF CORRECTION

PATENT NO. : 6,665,229 B2 Page 1 of 1
DATED : December 16, 2003
INVENTOR(S) : Lee et al.

It is certified that error appears in the above-identified patent and that said Letters Patent is hereby corrected as shown below:

Title Page,
Item [30], Foreign Application Priority Data, "May 23, 2001 (KR) ……….. 10-2001-28258" should read -- May 23, 2001 (KR) …………. 2001-28258 --.

Column 11,
Line 20, "word lines wherein" should read -- word lines, wherein --.

Signed and Sealed this

Twenty-ninth Day of June, 2004

JON W. DUDAS
*Acting Director of the United States Patent and Trademark Office*